United States Patent [19]
Yang

[11] Patent Number: 5,686,347
[45] Date of Patent: Nov. 11, 1997

[54] SELF ISOLATION MANUFACTURING METHOD

[75] Inventor: Sheng-Hsing Yang, Hsinchu, Taiwan

[73] Assignee: United Microelectronics Corporation, Hsin-Chu, Taiwan

[21] Appl. No.: 365,045

[22] Filed: Dec. 27, 1994

[51] Int. Cl.⁶ .................................................. H01L 21/76
[52] U.S. Cl. .................................................. 437/70; 437/72
[58] Field of Search ............ 437/70, 72; 148/DIG. 117, 148/DIG. 50, DIG. 85, DIG. 86

[56] References Cited

U.S. PATENT DOCUMENTS

| | | |
|---|---|---|
| 4,538,343 | 9/1985 | Pollack et al. ............... 437/70 |
| 4,622,096 | 11/1986 | Dic et al. . |
| 5,004,701 | 4/1991 | Motokawa . |
| 5,108,937 | 4/1992 | Tsai et al. .................... 437/40 |

FOREIGN PATENT DOCUMENTS

| | | |
|---|---|---|
| 55-22856 | 2/1980 | Japan . |
| 62-95339 | 4/1987 | Japan . |
| 62-126651 | 6/1987 | Japan . |
| 63-81832 | 4/1988 | Japan . |
| 63-100743 | 5/1988 | Japan . |
| 63-241949 | 10/1988 | Japan . |
| 119039 | 5/1989 | Japan . |
| 3-48942 | 3/1991 | Japan . |
| 4-151852 | 5/1992 | Japan . |
| 62-32394 | 8/1994 | Japan . |

OTHER PUBLICATIONS

Teng C., et al "Optimization of Sidewall Marked Isolation Process", IEEE Journal of Solid–State Circuits, vol. SC–20, No. 1, Feb. 1985.

Primary Examiner—George Fourson
Attorney, Agent, or Firm—William H. Wright

[57] ABSTRACT

A method provides for manufacturing an MOSFET semiconductor device with an array of semiconductor structures on a lightly doped semiconductor substrate. A mask is formed upon the substrate with openings therein. An oxide is formed in the semiconductor substrate. The oxide extends down into sunken regions in the substrate through the openings in the mask. The oxide is removed from the substrate opening the sunken regions in the substrate. Spacers are formed in the openings in the mask forming smaller openings in the spacers. Then, ions are introduced into the substrate below the sunken regions through the smaller openings to form channel stop regions. Then the spacers are removed. A second oxide is formed in the sunken regions.

34 Claims, 10 Drawing Sheets

FIG. 5 ise on a lightly doped semiconductor substrate is provided. A mask is formed upon the substrate with openings therein. An oxide is formed in the semiconductor substrate, the oxide extending down into sunken regions in the substrate through the openings in the mask. The oxide is removed from the substrate opening the sunken regions in the substrate. Ions are introduced into the substrate through the openings in the mask to form a doped region. Spacers are formed in the openings in the mask, the spacers forming smaller openings. Other ions are introduced into the substrate below the sunken regions through the smaller openings to form channel stop regions. The spacers are removed. A second oxide is formed in the sunken regions. The mask comprises silicon nitride. The mask is formed over a pad oxide on the substrate and the substrate comprises lightly doped silicon. The oxide comprises silicon dioxide field oxide. The field oxide is removed by etching thereby exposing the sunken regions. A blanket silicon dioxide spacer layer is formed over the-----

SELF ISOLATION MANUFACTURING METHOD

BACKGROUND OF THE INVENTION

1. Field of the Invention

This invention relates to semiconductor memory devices and more particularly to methods of manufacture thereof.

2. Description of Related Art

Catastrophic failure of semiconductor memory devices is caused by parasitic conducting paths leading to latchup. To overcome the failure, it is necessary to remove the power supply, resulting in system shut down. Then, with all of the risks of loss of data and all of inconvenience in loss of time caused by a system shut down, the system must be started up again. That sequence of events is totally unacceptable. In addition, latchup can lead to severe overheating of the devices which is clearly unacceptable because of the risk of damage to the hardware, which would lead to further delays, loss of data and costly repairs. Accordingly, in the past, for the purpose of avoiding latchup, device isolation has been used in the prior art to block the unwanted conduction paths between devices. Such isolation has been used to decouple adjacent transistors in an array by preventing current flow, including current flow between the devices, by means such as use of the LOCOS process and trench isolation. The state of the art limitations pertaining to self-isolation and latchup immunity are that the self-isolation region is lightly doped and the junction is shallow. If, on the other hand, the self-isolation region were heavily doped in conventional devices, the source/drain regions would have lower breakdown voltages, which is unacceptable.

Figure 1A:
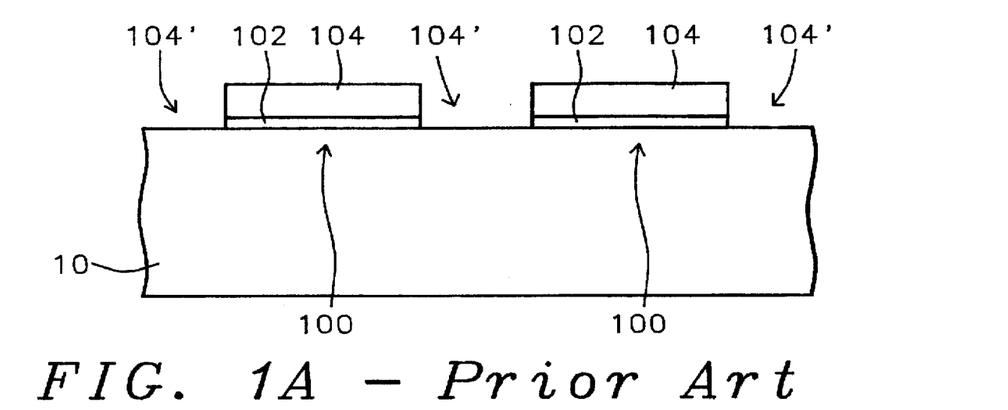
FIG. 1A shows a prior art semiconductor substrate with an active region above which are regions of pad oxide upon which are formed silicon nitride mask with openings therein for the purpose of providing a mask for ion implantation of channel stop regions seen in FIG. 1B through the openings.
Figure 1B:
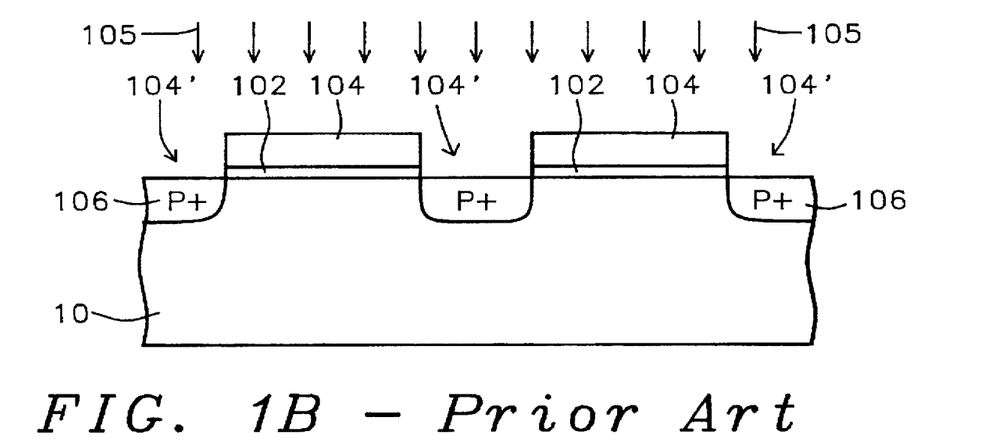
FIG. 1B shows the prior art device of FIG. 1A being exposed to ion implantation of P type or N type ions 105 through silicon nitride mask 104 into openings 104' therein.

FIG. 1A shows a prior art semiconductor substrate 10 with an active region 100 above which are regions of pad oxide 102 upon which are formed silicon nitride mask 104 with openings 104' therein for the purpose of providing a mask for ion implantation of channel stop regions 106 seen in FIG. 1B through the openings 104'.

FIG. 1B shows the prior art device of FIG. 1A being exposed to ion implantation of P type or N type ions 105 through silicon nitride mask 104 into openings 104' therein.

Figure 1C:
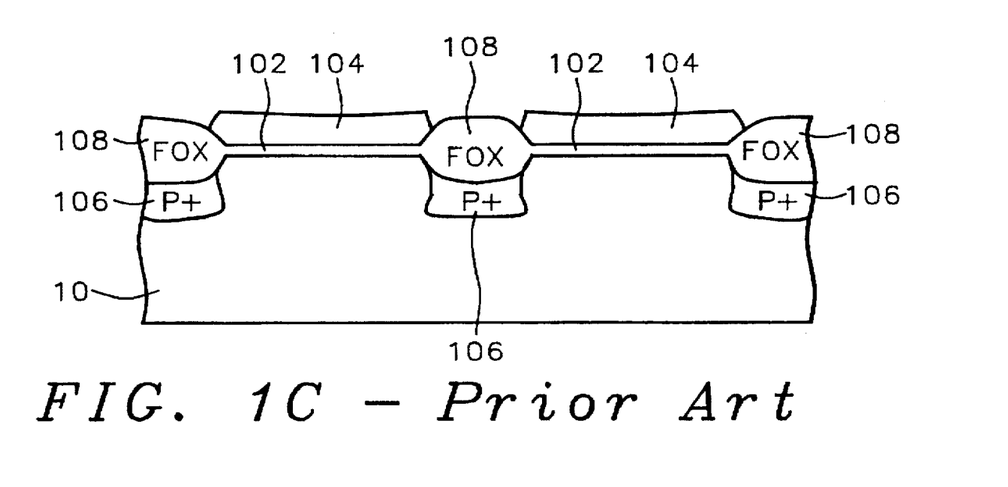
FIG. 1C shows the prior art device of FIG. 1B after use of a LOCOS process to form FOX regions 108 over the channel stop regions 106.

FIG. 1C shows the prior art device of FIG. 1B after use of a LOCOS process to form FOX regions 108 over the channel stop regions 106.

Figure 2:
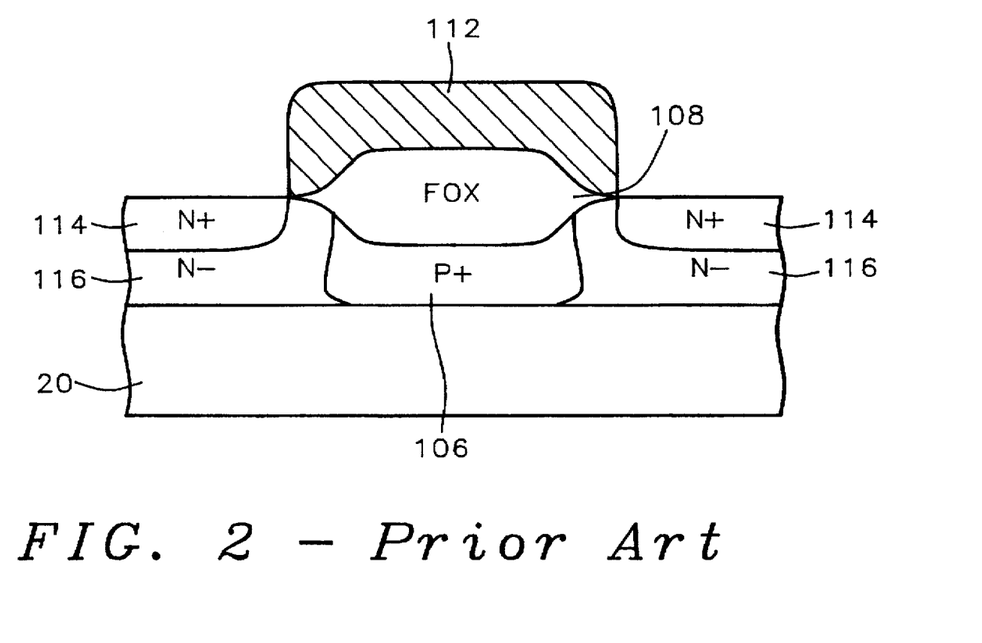
FIG. 2 shows a prior art a Double Doped Drain (DDD) type device.

FIG. 2 shows a prior art Double Doped Drain (DDD) type device. A semiconductor substrate 20 (with no active region 100) above which is a P+ channel stop regions 106 with N− regions 116 on either side thereof. Above the channel stop region 106 is a FOX region 108, with birds beaks extending over the upreaching section of N− regions 116. Above the N− regions 116 are N type doped regions 114 which are spaced away from the channel stop regions 106, each of which is slightly in contact with the tip end of the birds beak.

For the field effect device 20 of FIG. 2, if conductor 112 has a high voltage applied thereto, then this field effect device 20 must have a high field threshold voltage and a high breakdown voltage.

There are two possible methods of increasing the field threshold voltage and the breakdown voltage. The first is to increase the thickness of FOX region 108 for increasing the field threshold voltage, but this would increase the bird's beak which has the disadvantages of encroachment upon the usable active area of the device. The second is to increase the P+ doping to increase the field threshold voltage, but this would reduce the field effect device breakdown voltage which violates one of the requirements for use with high voltage.

The channel stop would not be highly doped because otherwise it would have a lower breakdown voltage between the S/D and the channel stop region.

U.S. Pat. No. 5,108,937 of Tsai et al for "Method of Making a Recessed Gate MOSFET Device Structure" forms regions referred to therein as "sunken silicon oxide areas" formed by the LOCOS process, one area of which "defines the gate electrode locations" end other areas of which "define field silicon oxide areas." The gate electrode locations are formed by removing the silicon oxide by selective etching in those areas where they are to be formed and forming a gate silicon oxide layer followed by forming a conductive layer over the gate silicon oxide layer in place of the removed sunken silicon oxide. The device forms a recessed gate, but does not relate to forming device isolation structures.

SUMMARY OF THE INVENTION

An object of this invention manufacture of high density semiconductor memory devices without a latchup problem.

In accordance with this invention, a method of manufacturing an MOSFET semiconductor device with an array of semiconductor structures on a lightly doped semiconductor substrate is provided. A mask is formed upon the substrate with openings therein. An oxide is formed in the semiconductor substrate. The oxide extends down into sunken regions in the substrate through the openings in the mask. The oxide is removed from the substrate opening the sunken regions in the substrate. Spacers are formed in the openings in the mask forming smaller openings in the spacers. Ions are introduced into the substrate below the sunken regions through the smaller openings to form channel stop regions. Then the spacers are removed. A second oxide is formed in the sunken regions.

Preferably, the mask comprises silicon nitride, the mask is formed over a pad oxide on the substrate and the substrate comprises lightly doped silicon. The oxide comprises silicon dioxide field oxide. The field oxide is removed by etching thereby exposing the sunken regions. A blanket silicon dioxide spacer layer is formed over the device filling the sunken regions at least in part. The spacer layer is etched back to form spacers. The introduction of ions into the substrate Is performed by ion implantation. The spacers are removed by etching. The second oxide comprises a field oxide.

In accordance with another aspect of this invention, a method of manufacturing an MOSFET semiconductor device with an array of semiconductor structures on a lightly doped semiconductor substrate is provided. A mask is formed upon the substrate with openings therein. An oxide is formed in the semiconductor substrate, the oxide extending down into sunken regions in the substrate through the openings in the mask. The oxide is removed from the substrate opening the sunken regions in the substrate. Ions are introduced into the substrate through the openings in the mask to form a doped region. Spacers are formed in the openings in the mask, the spacers forming smaller openings. Other ions are introduced into the substrate below the sunken regions through the smaller openings to form channel stop regions. The spacers are removed. A second oxide is formed in the sunken regions. The mask comprises silicon nitride. The mask is formed over a pad oxide on the substrate and the substrate comprises lightly doped silicon. The oxide comprises silicon dioxide field oxide. The field oxide is removed by etching thereby exposing the sunken regions. A blanket silicon dioxide spacer layer is formed over the device filling the sunken regions at least in part. The spacer layer is etched back forming the spacers. Ions are introduced into the substrate by ion implantation to form channel stop regions. The spacers are removed by etching. The second oxide comprises a field oxide.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

FIGS. 3A–3F show a process flow for producing a device in accordance with this invention.

Figure 3A:
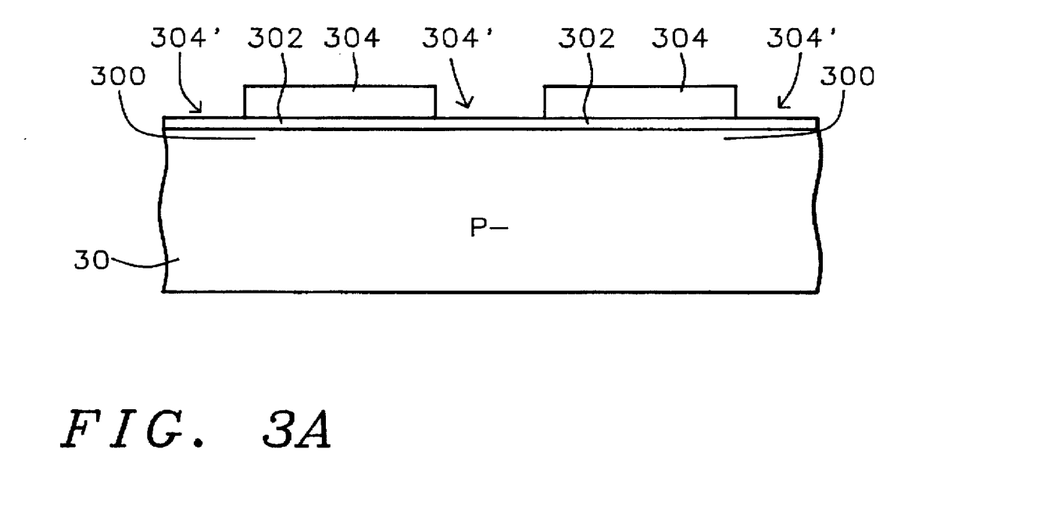
FIGS. 3A–3F show a process flow for producing a device in accordance with this invention.

FIG. 3A shows a P− silicon semiconductor substrate 30 that incorporates a first dopant for semiconductors, preferably in a concentration between about $1\times10^{13}$ to $1\times10^{17}$ atoms/cm$^3$. The substrate 10 is preferably monocrystalline silicon, although polycrystalline silicon, III–V compound semiconductors, silicon on insulator, (SOI) silicon on sapphire (SOS) etc. could possibly be utilized. The dopant, which is preferably P−, can be either P type or N, depending upon the type of MOSFET desired to be made as is well understood in the art.

In substrate 30, an active region 300 is formed near the surface of substrate 30 preferably in a concentration between about $2\times10^{15}$ atoms/cm$^3$ to $5\times10^{16}$ atoms/cm$^3$.

Above the active region 300, the surface of substrate 30 is oxidized to form a silicon dioxide (pad oxide which is a stress relief thermal oxide) layer 302 to a thickness between about 200Å and about 500Å. A silicon nitride layer 304 is formed over layer 302 by well known and conventional techniques. Portions of the silicon nitride layer 304 are removed by using standard lithography and etching techniques to form mask 304 with openings 304' therethrough.

Figure 3B:
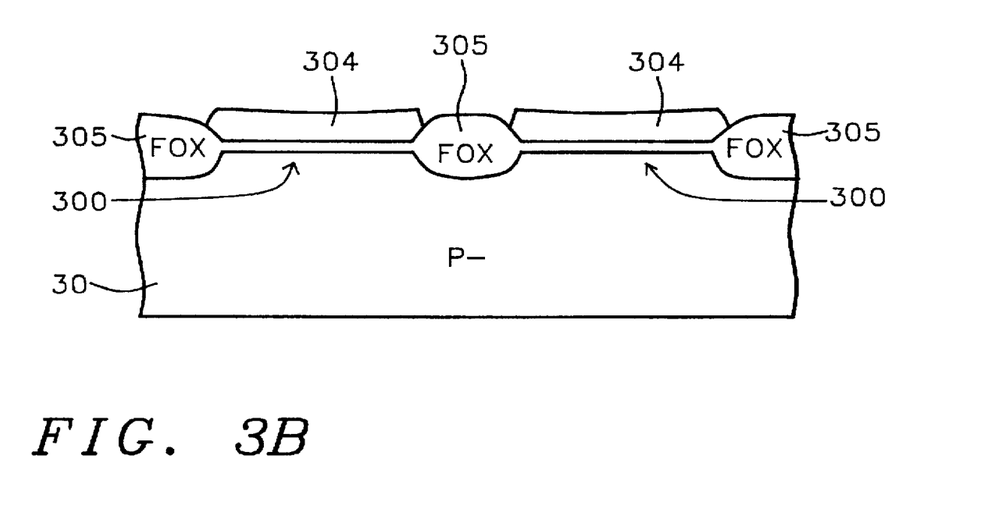

FIG. 3B shows the device of FIG. 3A after the device 30 has been placed in an oxidizing ambient environment to form silicon dioxide on substrate 30 through openings 304' in mask 304 and through pad oxide 302 therein using a LOCOS process to form sunken conventional silicon dioxide field oxide (FOX) regions 305 in the openings 304' and therebelow in the active region 300 near the surface of the substrate 30 and lower in the substrate 30 (below the active region 300.) The silicon dioxide FOX regions 305 have an overall thickness of between about 200 nanometers to 2,000 nanometers. The silicon dioxide FOX region extends between about 80 nanometers to 800 nanometers into the substrate 30. The process used to form FOX regions 305 is the well known LOCOS process.

Figure 3C:
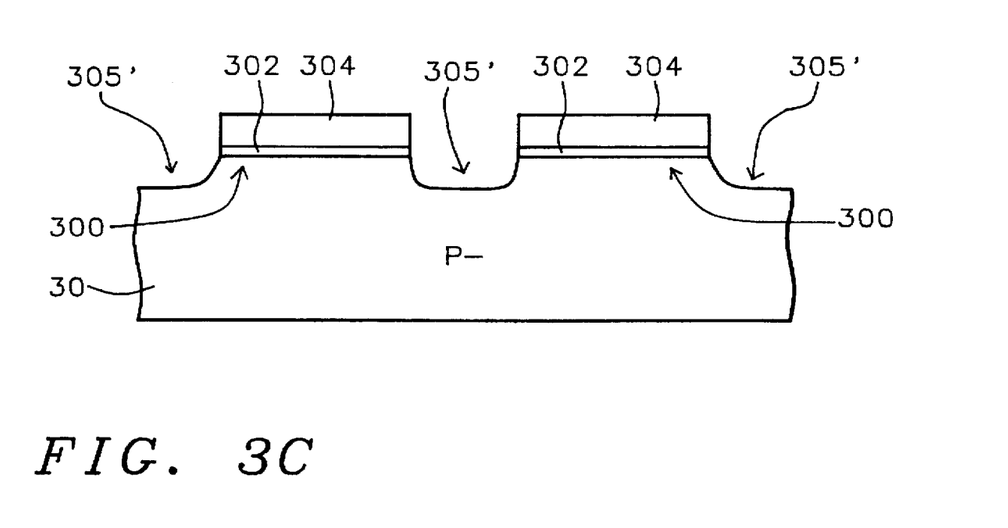

As shown in FIG. 3C, the FOX regions 305 have been removed leaving openings 305' in their place reaching down into the substrate 30 providing a parallel array of trenches 305' in the silicon substrate 30. The sunken silicon FOX regions 305 have all been removed using conventional etching technology using the mask 304 as an etch back mask. A conventional block out mask (not shown for convenience of illustration) is used to cover other areas. The etchant used is preferably buffered hydrofluoric acid solution.

Figure 3D:
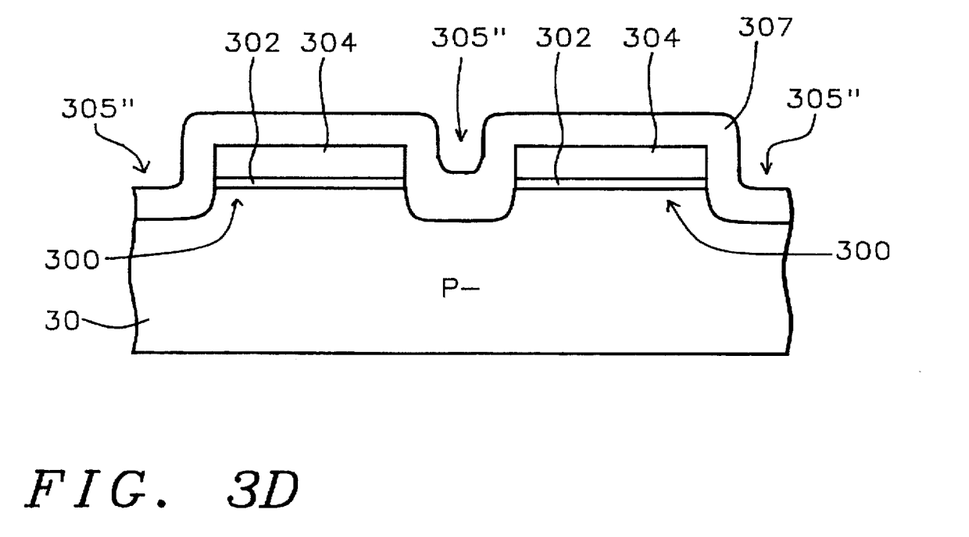

Referring to FIG. 3D, the device 30 of FIG. 3C is shown after a blanket, conformal, silicon dioxide spacer layer 307 has been formed on device 30 to a thickness between about 1,000Å to 8,000Å by means of a conventional CVD oxidation process. The blanket spacer layer 307 has depressions 305" therein located centrally above the openings 305'. Depressions 305" are narrower than openings 305' by the thickness of spacer layer 307 to the left and to the right. The range of widths of opening 305' and depressions 305" is between about 1 μm and about 3 μm.

Figure 3E:
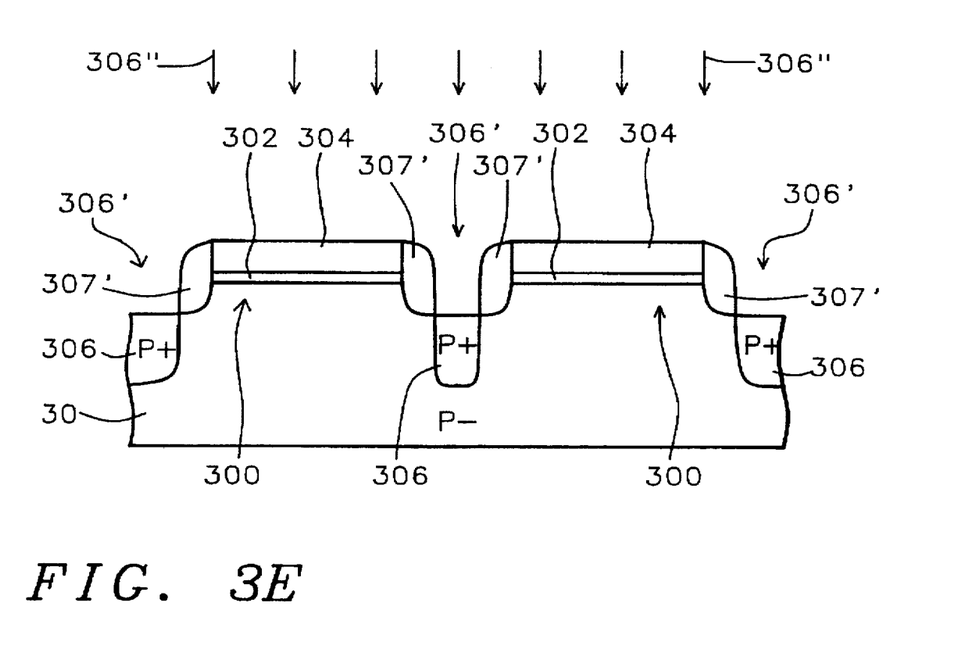

Next as shown in FIG. 3E an etch back process is performed to remove much of the blanket spacer layer 307 to forming spacers 307' at the ends of the mask 304, leaving narrow openings 306' between the confronting spacers 307' at the base of openings 305'.

Next, the device 30 Is subjected to ion implantation with P type ions 306", such as BF$_2$ ions. The structure is subjected to a field oxidation step to perform the drive-in of the ions 306". The resultant P+ channel stop regions 306, formed at the base of narrow openings 306' by this ion implanting step, have an average dopant concentration of between about $1\times10^{17}$ atoms/cm$^3$ to $5\times10^{18}$ atoms/cm$^3$. Note that the ends of P+ etch stop regions 306 are spaced well within the margins set by the openings 304' in silicon nitride mask 304 in FIG. 3A because of spacers 307'.

Figure 3F:
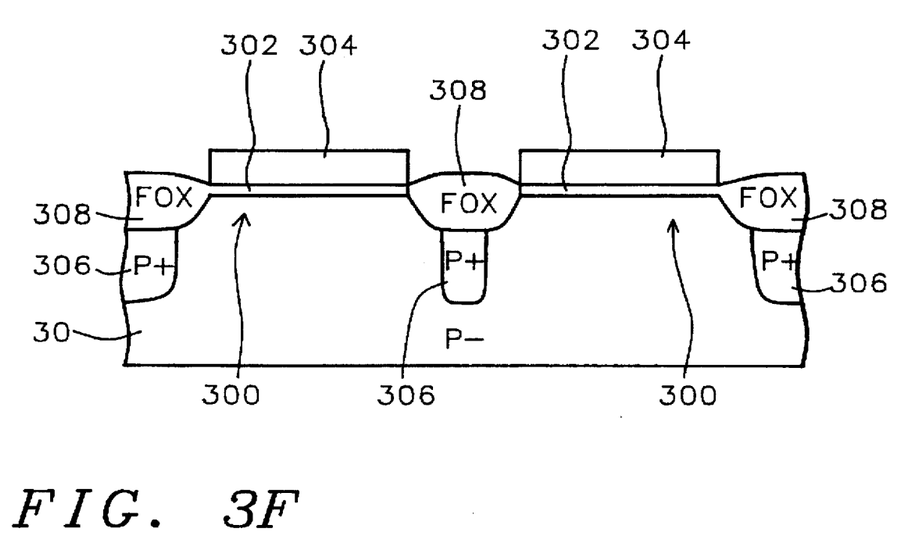

FIG. 3F shows the device of FIG. 3E after the spacers 307' have been etched away completely by use of a wet etchant such as an aqueous solution of hydrofluoric acid. That process left trenches 305' (shown previously in FIG. 3C) open once again, temporarily before the field oxidation step, which is described next, below.

FIG. 3F also shows the device after the device 30 has been placed in an oxidizing ambient environment to form once again field oxide regions 308 of silicon dioxide on substrate 30 through trenches 305' and mask 304 and through pad oxide 302 therein using a LOCOS process. As a result sunken silicon conventional field oxide (FOX) regions 308 are formed in the openings 304' and therebelow near the surface of the substrate 30 above the P+ stop regions 306. The silicon dioxide FOX regions 308 have an overall thickness of between about 200 nanometers and about 1,500 nanometers. The silicon dioxide FOX regions 308 extend between about 80 and about 800 nanometers into the substrate 30. The process used to form FOX regions 308 is the well known LOCOS process.

Figure 3G:
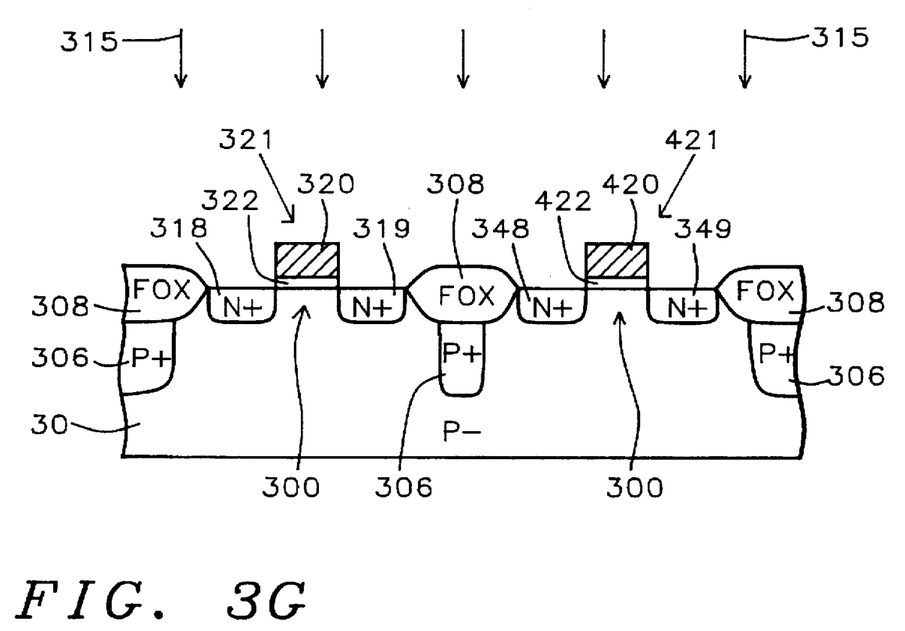
FIG. 3G shows the device of FIG. 3F after the device has been subjected to ion implantation with N type ions in two successive implantations to form the device source and drain regions

FIG. 3G shows the device of FIG. 3F after mask 304 has been stripped from device 30 and after the device 30 has been subjected to ion implantation with N type ions 315 in two successive implantations to form the device source and drain regions 318, 319, 348 and 349. Preferably, the source and drain regions 318, 319, 348 and 349 are formed using ion implantation techniques. Gate electrodes 320 and 420 have been added to form the FET transistors 321 and 421, as shown in FIG. 3G. The gate electrode 320 formed on gate oxide layer 322 cooperates with S/D regions 318/319 to form an FET transistor 321. The gate electrode 420 formed on gate oxide 422 cooperates with S/D regions 418/419 to form an FET transistor 421. Note that FOX regions 308 confine the dopant ions 315 to the S/D regions 318/319 and 418/419.

Preferably, the source and drain regions are graded, that is the regions are formed of a first highly doped region 318 adjacent at the surface of the substrate 30. (Optionally, these regions can be formed by the double diffused method.) Where N channel MOS FET devices are being formed, arsenic and phosphorus ions are implanted into the source and drain regions. The arsenic atoms are planned to form the N+ surface regions 318. (Optionally, phosphorus ions form underlying N– regions (not shown) beneath surface regions 318, so the concentration of ions implanted are accordingly adjusted.) In such an embodiment, the structure is annealed to cause forming the two regions, including region 318 and the region underlying region 318, since phosphorus moves faster than does arsenic in silicon at elevated temperatures. The average dopant concentration of N+ region 318 is between about $1 \times 10^{19}$ atoms/cm$^3$ to $1 \times 10^{20}$ atoms/cm$^3$. The N– region 316 has an average dopant concentration of between about $1 \times 10^{17}$ atoms/cm$^3$ to $1 \times 10^{18}$ atoms/cm$^3$. The ion bombardment is indicated by arrows 315.

The gate electrodes 320 and 420 are conductive electrodes which are deposited and patterned using standard photolithographic and etching techniques to leave gate electrodes 320. The gate electrodes 320 and 420 are preferably formed of polysilicon giving a thickness of between about 200 and 1000 nanometers. The polysilicon can be deposited as doped or undoped. If the polysilicon is deposited undoped, it is then doped to have an average dopant concentration with a sheet resistance of between about 20Ω/■ and about 30Ω/■.

However, the gate electrode 320 can be composed of other conductive materials such as aluminum alone, aluminum with silicon and/or copper, aluminum and refractory metal compounds (AlHf, AlSiTi, etc. refractory metals, etc.)

FIGS. 4A–4H show an alternate process flow for producing a device in accordance with this invention.

Figure 4A:
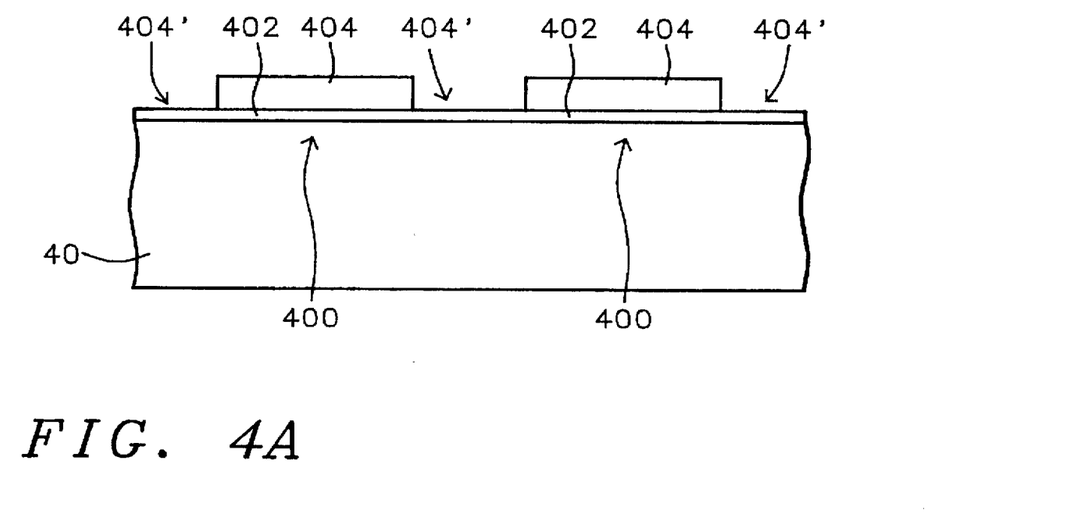
FIGS. 4A–4H show an alternate process flow for producing a device in accordance with this invention.

FIG. 4A shows a P– doped silicon semiconductor substrate 40 that incorporates a first dopant for semiconductors, preferably in a concentration between about $1 \times 10^{13}$ and about $1 \times 10^{17}$ atoms/cm$^3$. The substrate 40 is preferably monocrystalline silicon, although polycrystalline silicon, III–V compound semiconductors, silicon on insulator, (SOI) silicon on sapphire (SOS) etc. could possibly be utilized. The dopant, which is preferably P–, can be either P type or N type, depending upon the type of MOSFET desired to be made as is well understood in the art.

In substrate 40, an active region 400 is formed near the surface of substrate 40 preferably in a concentration between about $2 \times 10^{15}$ atoms/cm$^3$ to $5 \times 10^{16}$ atoms/cm$^3$.

Above the active region 400, the surface of substrate 40 is oxidized to form a silicon dioxide (pad oxide which is a stress relief thermal oxide) layer 402 to a thickness between about 200Å and about 500Å. A silicon nitride layer 404 is formed over layer 402 by well known and conventional techniques. Portions of the silicon nitride layer 404 are removed by using standard lithography and etching techniques to form mask 404 with openings 404' therethrough.

Figure 4B:
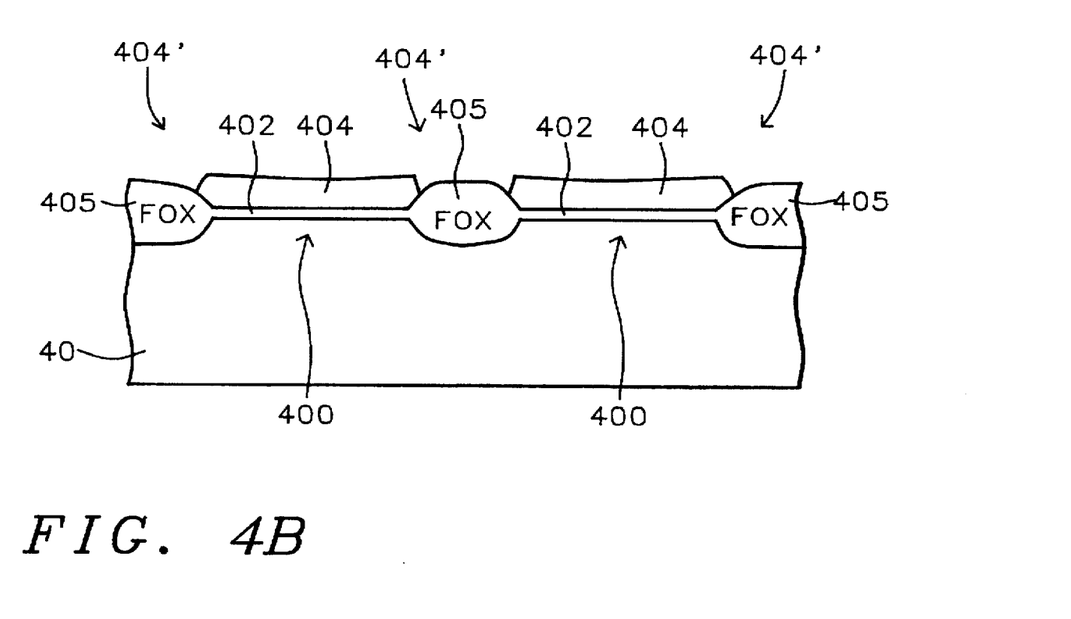

FIG. 4B shows the device of FIG. 4A after the device 40 has been placed in an oxidizing ambient environment to form silicon dioxide on substrate 40 through openings 404' in mask 404 and through pad oxide 402 therein using a LOCOS process to form sunken silicon conventional field oxide (FOX) regions 405 In the openings 404' and therebelow in the active region 400 near the surface of the substrate 40 and lower In the substrate 40 (below the active region 400) The silicon dioxide FOX regions 405 have an overall thickness of between about 200 nanometers to 2,000 nanometers. The silicon dioxide FOX region extends between about 80 nanometers to 800 nanometers into the substrate 40. The process used is the well known LOCOS process to form FOX regions 405.

Figure 4C:
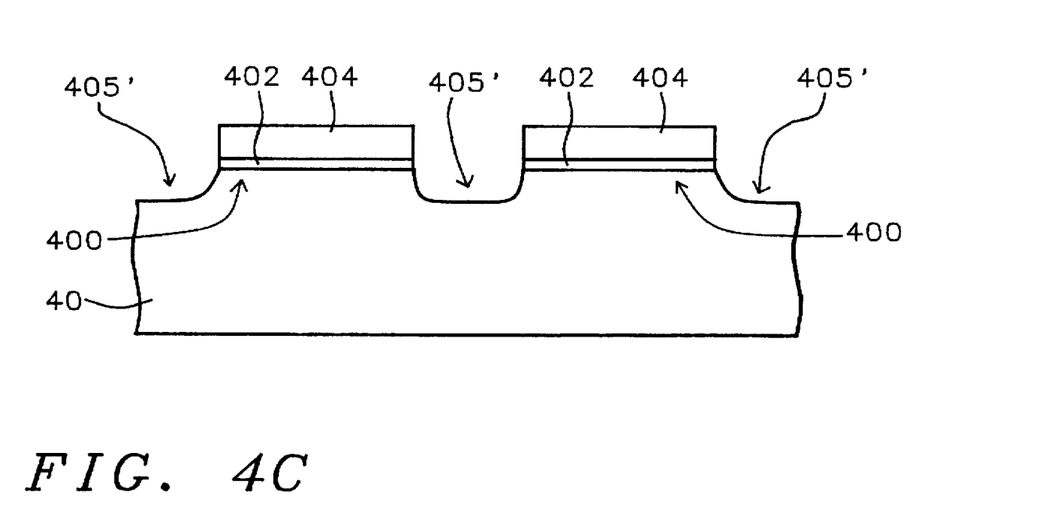

As shown in FIG. 4C, the FOX regions 405 have been removed leaving openings 405' in their place reaching down into the substrate 40 providing a parallel array of trenches 405'. The sunken silicon FOX regions 405 are all removed using conventional etching technology using the mask 404 as an etch back mask. A conventional block out mask is used to cover other areas. The etchant used is preferably buffered hydrofluoric acid solution.

Figure 4D:
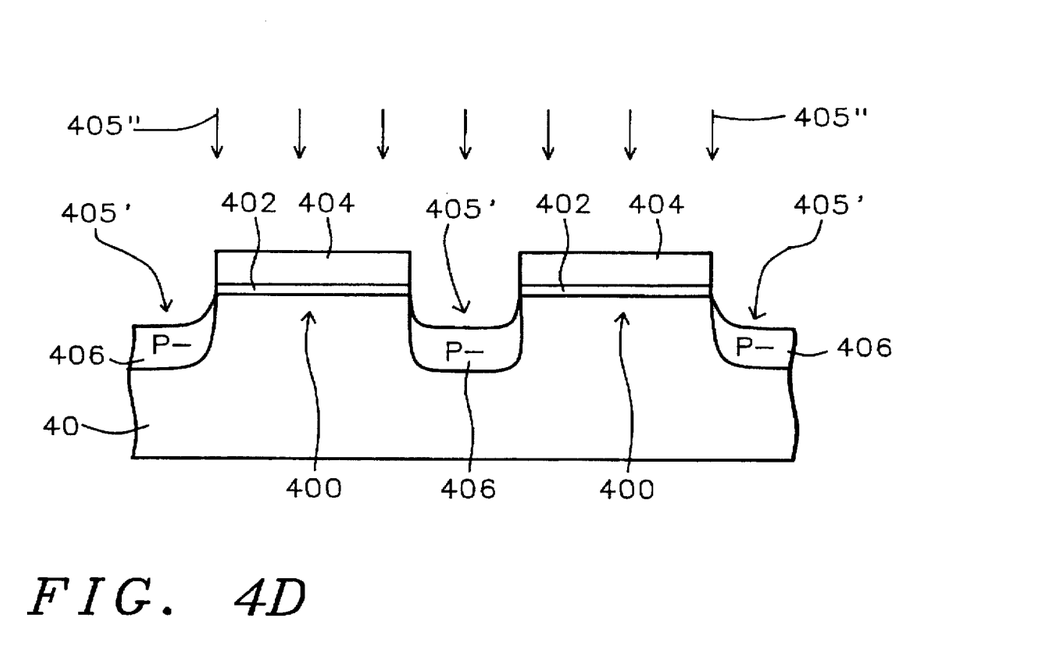

As shown in FIG. 4D, the device 40 is subjected to ion implantation with P– type ions 405", such as boron ions. The structure is subjected to a field oxidation step to perform the drive-in of the ions 405". The resultant P– lightly doped channel stop regions 406, formed at the base of openings 405' by this ion implanting step, have an average dopant concentration of between about $5 \times 10^{16}$ atoms/cm$^3$ and about $5 \times 10^{17}$ atoms/cm$^3$.

Figure 4E:
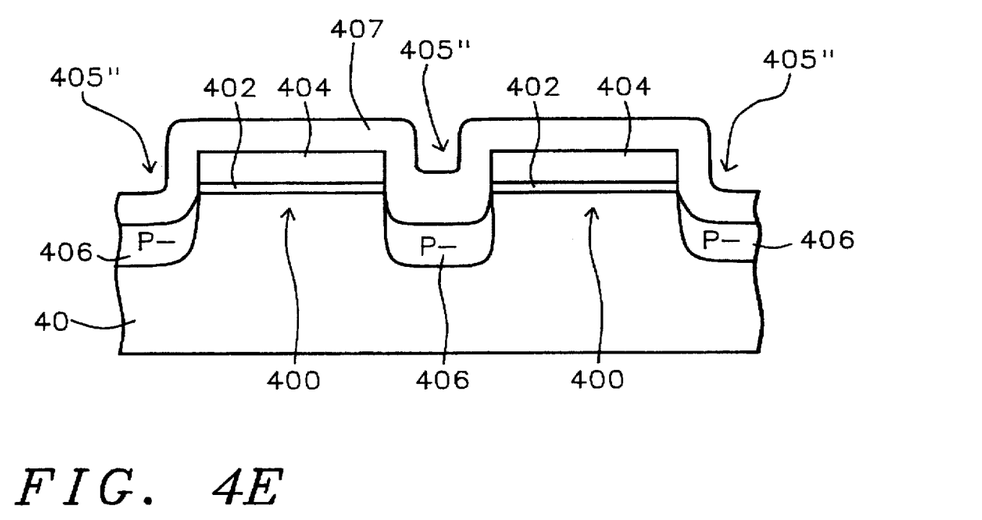

Referring to FIG. 4E, the device 40 of FIG. 4D is shown after a blanket, conformal silicon dioxide spacer layer 407 has been formed thereon to a thickness between about 1,000Å and about 8,000Å by means of a conventional CVD oxidation process. The blanket spacer layer 407 has depressions 405" therein located centrally above the openings 405'. Depressions 405" are narrower than openings 405' by the thickness of spacer layer 407 to the left and to the right. The range of widths of opening 405' and depressions 405" is between about 1 μm and about 3 μm.

Figure 4F:
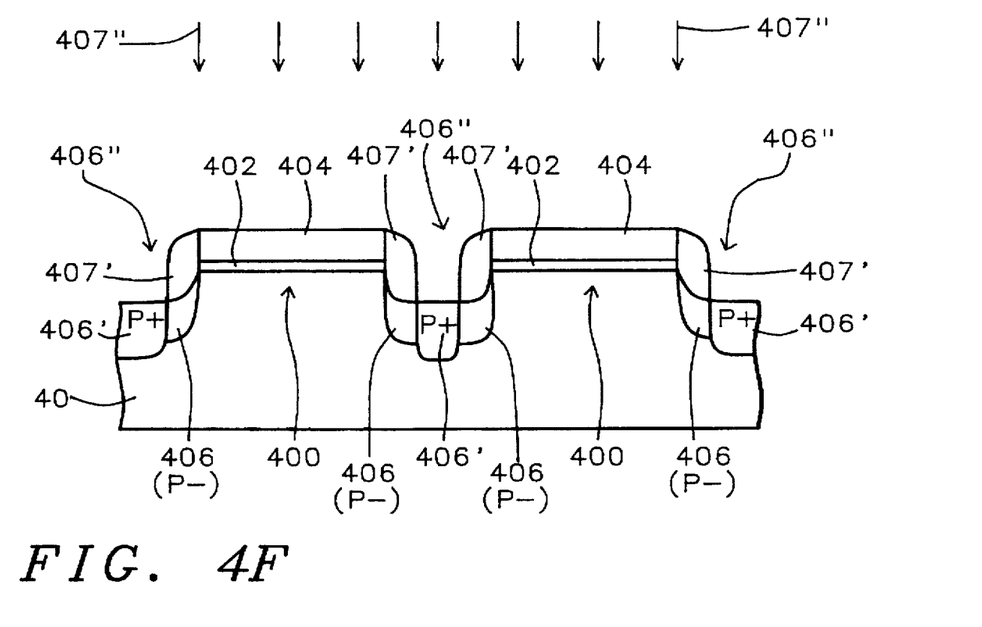

Next as shown in FIG. 4F an etch back process is performed upon the blanket spacer layer 407 to form spacers 407' at the ends of the mask 404 leaving narrow openings 406" between the confronting spacers 407'.

Next, the device 40 is subjected to ion implantation with P type ions 407", such as BF$_2$ ions. The structure is subjected to a field oxidation step to perform the drive-in of the ions 405". The resultant P+ highly doped channel stop regions 406", formed at the base of narrow openings 406" by this ion implanting step, have an average dopant concentration of between about $1 \times 10^{17}$ to $5 \times 10^{18}$ atoms/cm$^3$. Note that the ends of highly doped P+ etch stop regions 406' are spaced well within the margins set by the openings 404' in silicon nitride mask 404 in FIG. 4A because of spacers 407'.

Figure 4G:
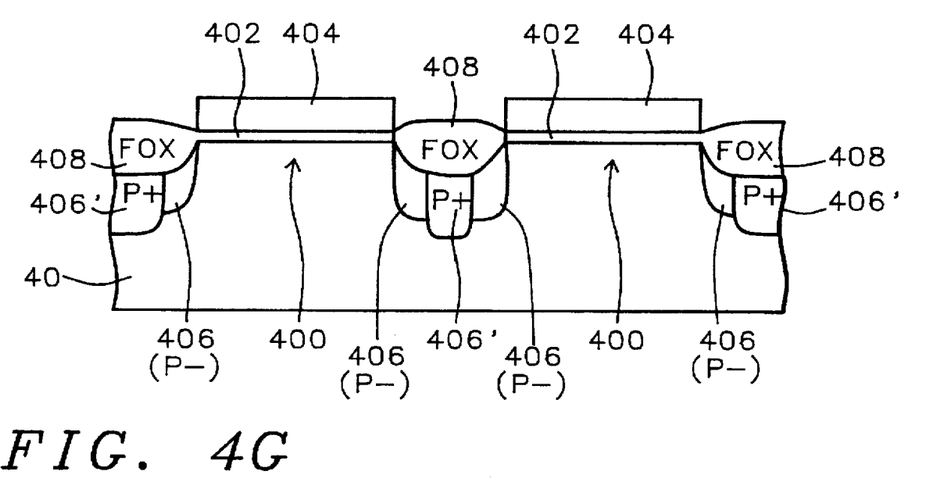

FIG. 4G shows the device of FIG. 4F after the spacers 407' have been completely etched away by using a wet etchant such as an aqueous solution of hydrofluoric acid leaving trenches 405' (shown previously in FIG. 4C) open once again.

FIG. 4G also shows the device 40 after treatment in an oxidizing ambient environment to reform silicon dioxide on substrate 40 through trenches 405' and mask 404 and through pad oxide 402 therein using a LOCOS process to form sunken silicon conventional field oxide (FOX) regions 408 in the openings 404' and therebelow near the surface of the substrate 40 above the P– lightly doped, channel stop regions 406 and P+ highly doped, channel stop regions 406'. The silicon dioxide FOX regions 408 have an overall thickness of between about 200 to 1,500 nanometers. The silicon dioxide FOX regions 408 extend between about 80 to 800 nanometers into the substrate 40. The process used is the well known LOCOS process to form FOX regions 408.

Figure 4H:
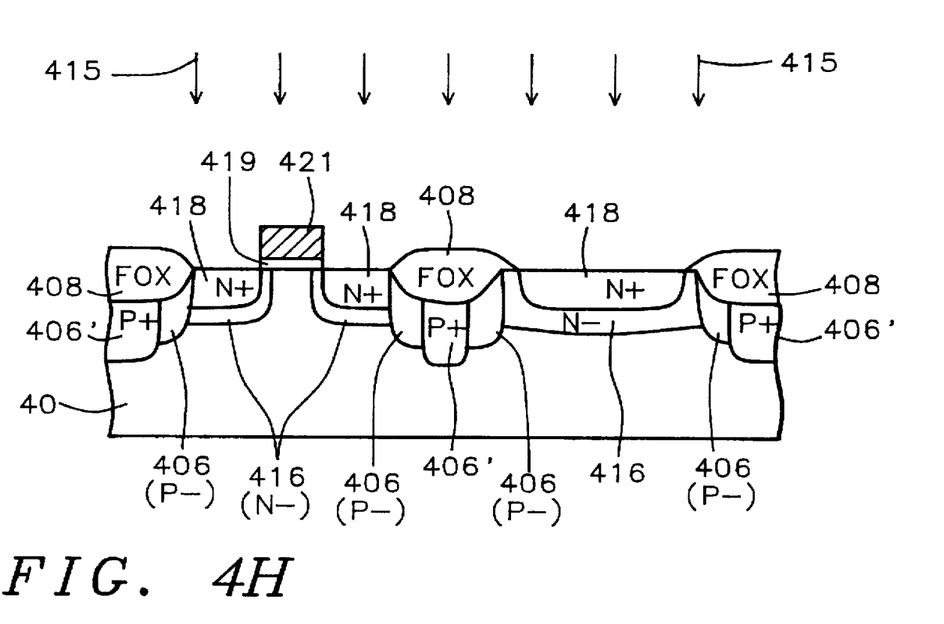

FIG. 4H shows the device of FIG. 4G after mask 404 has been stripped from device 40 and after the device 40 was subjected to ion implantation with N type ions 405" in two successive implantations to form the device source and drain regions 416 and 418. Preferably, the source and drain regions are formed using ion implantation techniques. Note that the FOX regions 408 confine dopant ions to regions 418 S/D. Preferably, the source and drain regions are graded, that is the regions are formed of a first highly doped region 418 adjacent at the surface of the substrate 40. These regions can be formed by the double diffused method. Where N channel MOS FET devices are being formed, arsenic and phosphorus ions are implanted into the source and drain regions. The arsenic atoms are planned to form the N+ surface regions 418 and phosphorus ions are planned to form the underlying N− regions 416, so the concentration of ions implanted are accordingly adjusted. The structure is annealed to cause forming the two regions 416 and 418, since phosphorus moves faster than does arsenic in silicon at elevated temperatures. The N+ region 418 has an average dopant concentration of between about $1 \times 10^{19}$ to $1 \times 10^{20}$ atoms/cm$^3$. The N− region 416 has an average dopant concentration of between about $1 \times 10^{17}$ to $1 \times 10^{18}$ atoms/cm$^3$. The ion bombardment is indicated by arrows 415.

The gate electrode 420 is a conductive electrode, which is deposited and selectively removed using standard photolithographic and etching techniques to leave a gate electrode 420. The gate electrode 420 is preferably formed of polysilicon giving a thickness of between about 200 and 1000 nanometers. The polysilicon can be deposited as doped or undoped. If the polysilicon is deposited undoped, it is then doped to have an average dopant concentration with a sheet resistance of between about 20Ω/■ and about 30Ω/■. However, the gate electrode 420 can be composed of other conductive materials such as aluminum alone, aluminum with silicon and/or copper, aluminum and refractory metal compounds (AlHf, AlSiTi, etc. refractory metals, etc.)

Figure 5:
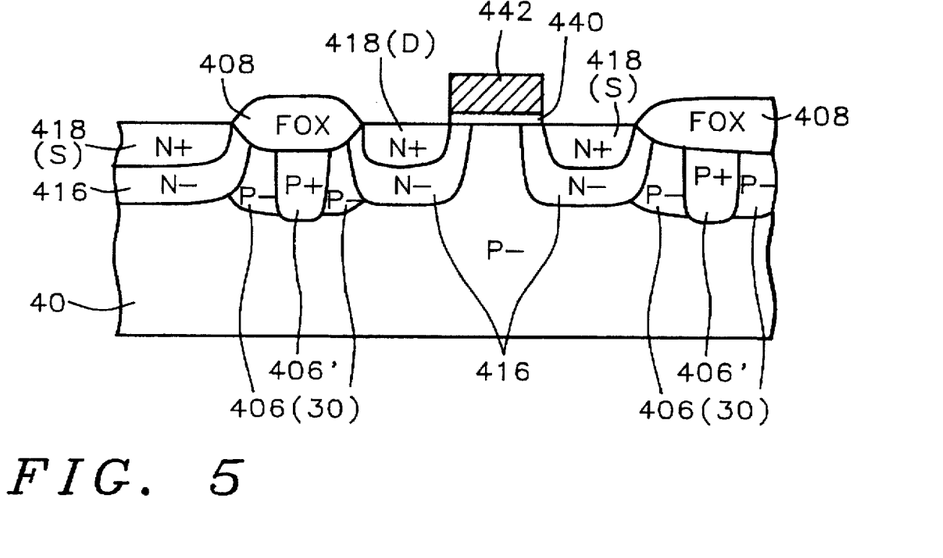
FIG. 5 shows a fragment of the product of FIG. 4H.

FIG. 5 shows a fragment of the product of FIG. 4H which is a device produced by the process of FIGS. 4A–4H. Next to the highly doped channel stop regions 406' in FIG. 5 are the lightly doped P− regions 406(30) which are incorporated to increase the S/D junction breakdown voltage. A pair of FET transistors 321 and 421 with gate electrodes 320 and 420 formed over gate oxide layers 322 and 422 respectively. Source/Drain regions 418 are juxtaposed with the gate electrodes in the usual configuration in the substrate 40. Below the heavily doped S/D regions 418 are lightly doped N− regions 416. This self-isolation method is suitable to high voltage applications and high-low mixed voltage applications and does not need to increase the field oxide thickness. Another advantage is that the topology is quite planar.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacturing a MOSFET semiconductor device with an array of semiconductor structures on a silicon substrate in the sequence of steps as follows:

forming upon said silicon substrate a mask with openings through said mask, placing said device in an oxidizing ambient environment to form first silicon dioxide regions in said silicon substrate through said openings in said mask by a process of local oxidation of silicon, said first silicon dioxide regions extending down into sunken regions in said silicon substrate, removing said first silicon dioxide regions from said silicon substrate opening said sunken regions in said silicon substrate, depositing a blanket silicon dioxide spacer layer over said device filling said sunken regions at least in part and then forming spacers in said openings in said mask at the sides of said sunken regions to form narrow openings which are narrower than said sunken regions between said spacers, introducing ions into said substrate below said sunken regions through said narrow openings to form channel stop regions below said sunken regions, removing said spacers, and placing said device in an oxidizing ambient environment to form second silicon dioxide regions in said sunken regions.

2. A method in accordance with claim 1 wherein said channel stop regions are formed at the base of said narrow openings by ion implanting an average dopant concentration of between about $1 \times 10^{17}$ atoms/cm$^3$ to $5 \times 10^{18}$ atoms/cm$^3$.

3. A method in accordance with claim 2 wherein said mask comprises silicon nitride formed over a pad oxide on said substrate.

4. A method in accordance with claim 3 wherein said first silicon dioxide regions are removed by etching thereby exposing said sunken regions.

5. A method in accordance with claim 4 wherein said spacer layer is etched back forming said spacers.

6. A method in accordance with claim 5 wherein said spacers are removed by etching.

7. A method of manufacturing a MOSFET semiconductor device with an array of semiconductor structures on a silicon substrate comprising:

forming upon said silicon substrate a mask with openings therein, placing said device in an oxidizing ambient environment to form first silicon dioxide regions in said silicon substrate through said openings in said mask by a process of local oxidation of silicon, said first silicon dioxide regions extending down into sunken regions in said silicon substrate, removing said first silicon dioxide regions from said silicon substrate opening said sunken regions in said silicon substrate, introducing ions into said silicon substrate through said openings in said mask forming first channel stop regions below said openings, depositing a blanket silicon dioxide spacer layer over said device filling said sunken regions at least in part and then forming spacers in said openings in said mask at the sides of said sunken regions to form narrow openings which are narrower than said sunken regions between said spacers, introducing other ions into said silicon substrate below said sunken regions through said narrow openings to form second channel stop regions narrower than the first channel stop regions below said sunken regions, removing said spacers, and placing said device in an oxidizing ambient environment to form second silicon dioxide regions in said sunken regions.

8. A method in accordance with claim 7 wherein said first channel stop regions are formed by ion implanting an average dopant concentration of between about $5 \times 10^{16}$ atoms/cm$^3$ to $5 \times 10^{17}$ atoms/cm$^3$ and said second channel stop regions have an average dopant concentration of between about $1 \times 10^{17}$ atoms/cm$^3$ and about $5 \times 10^{18}$ atoms/cm$^3$.

9. A method in accordance with claim 8 wherein said mask comprises silicon nitride formed over a pad oxide on said substrate.

10. A method in accordance with claim 9 wherein said first silicon dioxide regions are removed by etching thereby exposing said sunken regions.

11. A method in accordance with claim 10 wherein said spacer layer is etched back forming said spacers.

12. A method in accordance with claim 11 wherein said spacers are removed by etching with an aqueous solution of hydrofluoric acid.

13. A method of manufacturing a MOSFET semiconductor device with an array of semiconductor structures on a semiconductor substrate comprising steps in the sequence as follows:

said method commencing with a work piece comprising said semiconductor substrate having a surface with an oxide layer formed on said surface and a field oxide mask formed over said oxide layer, said field oxide mask having openings therethrough, and said semiconductor substrate having field oxide regions extending down into sunken regions in said semiconductor substrate below said openings in said field oxide mask, said method comprising steps in the sequence as follows:

removing said field oxide regions from said semiconductor substrate opening said sunken regions in said semiconductor substrate, forming spacers in said openings in said mask forming narrow openings narrower than said sunken regions between said spacers, introducing ions into said semiconductor substrate below said sunken regions through said narrow openings to form channel stop regions below sunken regions, removing said spacers, and forming second field oxide regions in said sunken regions, whereby said channel stop regions are covered and said sunken regions are filled with said second field oxide regions.

14. A method in accordance with claim 13 wherein said channel stop regions are formed at the base of said narrow openings by ion implanting an average dopant concentration of between about $1 \times 10^{17}$ atoms/cm$^3$ to $5 \times 10^{18}$ atoms/cm$^3$.

15. A method in accordance with claim 14 wherein said mask comprises silicon nitride formed over a pad oxide on said substrate.

16. A method in accordance with claim 15 wherein said field oxide is removed by etching thereby exposing said sunken regions.

17. A method in accordance with claim 16 wherein the process of forming said spacers begins with formation of a blanket silicon dioxide spacer layer over said device filling said sunken regions at least in part.

18. A method in accordance with claim 17 wherein said spacer layer is etched back forming said spacers.

19. A method in accordance with claim 18 wherein said spacers are removed by etching.

20. A method of manufacturing a MOSFET semiconductor device with an array of semiconductor structures on a semiconductor substrate, said method commencing with a work piece comprising said semiconductor substrate having a surface with an oxide layer formed on said surface and a field oxide mask formed over said oxide layer, said field oxide mask having openings therethrough, and said semiconductor substrate having field oxide regions extending down into sunken regions in said semiconductor substrate below said openings in said field oxide mask, said method comprising steps in the sequence as follows:

removing said field oxide regions from said semiconductor substrate opening said sunken regions in said semiconductor substrate, introducing ions into said semiconductor substrate through said openings in said mask forming first channel stop regions below said openings, forming spacers in said openings in said mask forming narrow openings narrower than said sunken regions between said spacers, introducing ions into said semiconductor substrate below said sunken regions through said narrow openings to form second channel stop regions narrower than said first channel stop regions below said sunken regions, removing said spacers, and forming second field oxide regions in said sunken regions, whereby said first and second channel stop regions are covered and said sunken regions are filled with said second field oxide regions.

21. A method in accordance with claim 20 wherein said second channel stop regions are formed at the base of said narrow openings by ion implanting an average dopant concentration of between about $1 \times 10^{17}$ atoms/cm$^3$ to $5 \times 10^{18}$ atoms/cm$^3$.

22. A method in accordance with claim 21 wherein said mask comprises silicon nitride formed over a pad oxide on said substrate.

23. A method in accordance with claim 22 wherein said field oxide is removed by etching thereby exposing said sunken regions.

24. A method in accordance with claim 23 wherein the process of forming said spacers begins with formation of a blanket silicon dioxide spacer layer over said device filling said sunken regions at least in part.

25. A method in accordance with claim 24 wherein said spacer layer is etched back forming said spacers.

26. A method in accordance with claim 25 wherein said spacers are removed by etching.

27. A method in accordance with claim 1 wherein after forming said second silicon dioxide regions in said sunken regions, said mask is stripped from said device and subsequently FET transistors are formed in said substrate including S/D regions and gate electrodes.

28. A method in accordance with claim 6 wherein after forming said second silicon dioxide regions in said sunken regions, said mask is stripped from said device and subsequently FET transistors are formed in said substrate including S/D regions and gate electrodes.

29. A method in accordance with claim 7 wherein after forming said second silicon dioxide regions an said sunken regions, said mask is stripped from said device and subsequently FET transistors are formed in said substrate including S/D regions and gate electrodes.

30. A method in accordance with claim 12 wherein after forming said second silicon dioxide regions in said sunken regions, said mask is stripped from said device and subsequently FET transistors are formed in said substrate including S/D regions and gate electrodes.

31. A method in accordance with claim 13 wherein after forming said second field oxide regions in said sunken regions, said mask is stripped from said device and subsequently FET transistors are formed in said substrate including S/D regions and gate electrodes.

32. A method in accordance with claim 19 wherein after forming said second field oxide regions in said sunken regions, said mask is stripped from said device and subsequently FET transistors are formed in said substrate including S/D regions and gate electrodes.

33. A method in accordance with claim 20 wherein after forming said second field oxide regions in said sunken regions, said mask is stripped from said device and subsequently FET transistors are formed in said substrate including S/D regions and gate electrodes.

34. A method in accordance with claim 26 wherein after forming said second field oxide regions in said sunken regions, said mask is stripped from said device and subsequently FET transistors are formed in said substrate including S/D regions and gate electrodes.

* * * * *